United States Patent [19]

Kennedy et al.

[11] 4,183,797
[45] Jan. 15, 1980

[54] TWO-SIDED BIAS SPUTTER DEPOSITION METHOD AND APPARATUS

[75] Inventors: Thomas N. Kennedy, San Jose; William C. Lester, Los Gatos; George W. McDonough, Cupertino; John D. Michaelsen, Los Gatos, all of Calif.

[73] Assignee: International Business Machines Corporation, Armonk, N.Y.

[21] Appl. No.: 972,593

[22] Filed: Dec. 22, 1978

[51] Int. Cl.² ............................................. C23C 15/00
[52] U.S. Cl. .................................. 204/192 R; 204/298
[58] Field of Search ............................ 204/298, 192 R

[56] References Cited

U.S. PATENT DOCUMENTS

| | | | |
|---|---|---|---|
| 3,627,663 | 12/1971 | Davidse | 204/192 |
| 3,741,886 | 6/1973 | Urbanek et al. | 204/298 |
| 3,878,085 | 4/1975 | Corbani | 204/298 |
| 3,979,273 | 9/1976 | Panzera et al. | 204/192 |
| 4,013,532 | 3/1977 | Cormia et al. | 204/298 |
| 4,073,262 | 2/1978 | Scheffel et al. | 118/52 |

OTHER PUBLICATIONS

D. R. Rogalla, Coating Magnetic Storage Disks; IBM Technical Disclosure Bulletin, vol. 11, No. 11, Apr. 1969, p. 1611.

Primary Examiner—John H. Mack
Assistant Examiner—William Leader
Attorney, Agent, or Firm—Pollock, Vande Sande & Priddy

[57] ABSTRACT

Method and apparatus for coating a thin film upon a substrate in a vacuum chamber using the sputter deposition technique on both sides of the substrate without rotation of the substrate. The substrate is held between two movable rams and is located between two targets equal to or larger in size than the substrate. The rams supply power and cooling to the substrate. A glow suppression ring circumscribes the periphery of the substrate. The cathodes of the sputtering system can be magnetically enhanced for concentration of the sputtering plasma.

12 Claims, 3 Drawing Figures

TWO-SIDED BIAS SPUTTER DEPOSITION METHOD AND APPARATUS

DESCRIPTION

Technical Field

This invention relates generally to a sputtering process and apparatus for coating by cathode sputtering. More particularly, the present invention relates to bias sputtering apparatus and method for coating both sides of a substrate in one operation.

In the sputter etching and deposition of material, it is often necessary to coat both sides of the substrate. Because of the necessity to apply a voltage to the substrate and to cool the substrate during the sputtering operation, normally only one side of the substrate was coated at a time with the substrate being fastened to a base plate which was cooled by a cooling liquid and connected to a voltage source. The mounted substrate was then placed into a vacuum chamber where the pressure was lowered and a rare gas was inserted to sustain the plasma after the voltages are applied to the target and the substrate.

One object of the present invention, therefore, is to provide an apparatus for sputter depositing a material onto both sides of a substrate without rotating the substrate by supporting the substrate through rams extending from the center of the cathode/target located on both sides of the substrate.

Another object of the present invention is to provide a cathode sputtering system that includes a cathode/target that is larger than the substrate to be coated with a separate cathode/target provided on both sides of the substrate for simultaneous coating of both sides with the substrate fastened to rams that extend through the center of at least one of the cathode/targets and supplies power and coolant to the substrate for the sputtering operation.

Yet another object of the present invention is to provide apparatus for bias sputter deposition of both sides of the substrate without requiring the rotation of the substrate during the sputtering operation.

BACKGROUND ART

As suggested in U.S. Pat. No. 3,979,273 to Panzera et al, it is well known to sputter deposit both sides of a substrate by rotating the substrate between targets in the vacuum chamber. The substrate is in the shape of a cylinder which therefore requires that the substrate be rotated during the deposition process. There is no disclosure in this patent of a means for depositing on both sides of a substrate at one time without rotation by supporting a substrate through the center of the cathode targets.

U.S. Pat. No. 3,741,996 to Urbanek et al suggests a cathode/target that is larger than the substrate to be coated. This patent to Urbanek et al is typical of the prior art where the substrate is supported by a platform table which supplies the cooling and power for operation of the sputter deposition. The substrate is not rotated during the deposition process but only one side of the substrate is coated at one time because of the supporting table covering the second side of the substrate. Further, the substrate is not supported through the center of the cathode/target nor is it apparent from this patent how the support could be accomplished.

U.S. Pat. No. 4,073,262 to Scheffel et al suggests apparatus for the manufacture of magnetic coating of magnetic disks consisting of a means for coating both sides of a disk by spraying the coating material onto both sides of the substrate at one time. The substrate is supported by a ram extending from the center of a cover disk which prevents the sprayed material from escaping into the atmosphere.

The cover plates also provide an aerodynamic effect on the spreading of the dispersion over the disks during a spinning operation. The patent does not discuss the apparatus that would be involved in the sputter deposition of a similar substrate. There is no teaching in the patent how a substrate could be supported from the center of a cathode/target to accomplish a sputter deposition of both sides of the substrate without revolving the substrate.

U.S. Pat. No. 3,189,535 to Webb suggests a dual cathode target system for coating a spherical substrate. The sphere is supported on one end and rotated within for complete coverage. There is no disclosure of a means for supporting the substrate by way of the support from the center of the cathode target for even coating.

An IBM Technical Disclosure Bulletin entitled "Coating Magnetic Storage Disks," April 1969 at page 1611 discloses apparatus consisting of two plain parallel cathodes between which a magnetic disk substrate is located affixed to a rotating anode turntable. There is no showing of the apparatus by which the dual coating is attained and it does not appear that the substrate is supported parallel to the two parallel cathodes.

U.S. Pat. No. 3,878,085 to Corbani; Chapin, The Planar Magnetron, Vacuum Technology Research/Development, January 1974, pages 37-40; and Cormia et al, Magnetically Enhanced High-Rate Sputtering, Proceed. ElectroChemical Soc., September 1974 are of interest with respect to magnetically-enhanced sputtering.

DISCLOSURE OF INVENTION

In accordance with the present invention, a magnetically enhanced cathode sputtering apparatus performs the coating of both sides of a substrate through a ram means extending through the center of at least one of the cathode/targets located on both sides of the substrate. The ram means provides a support for the substrate as well as providing power and coolant to the substrate during the sputtering operation. Magnets are located behind each of the cathode/targets in order to magnetically enhance the sputter deposition operation. Glow suppression is provided around the periphery of the substrate in order to ensure the uniformity of the Crookes dark space thickness all of the way to the substrate edge. This will also maximize thickness uniformity across the substrate. The cathode/targets and substrates are located within a vacuum chamber that includes means for evacuating the air from the chamber and means for inserting a gas capable of supporting a sputtering operation (e.g., a rare gas such as argon). The target/cathodes are mounted parallel to the substrate and on opposite sides thereof.

BRIEF DESCRIPTION OF DRAWINGS

The various novel features of this invention, along with the foregoing and other objects as well as the invention itself both as to its organization and method of operation, may be more fully understood from the following description of illustrated embodiments when read in conjunction with the accompanying drawings wherein.

BEST MODE FOR CARRYING OUT INVENTION

Figure 1:
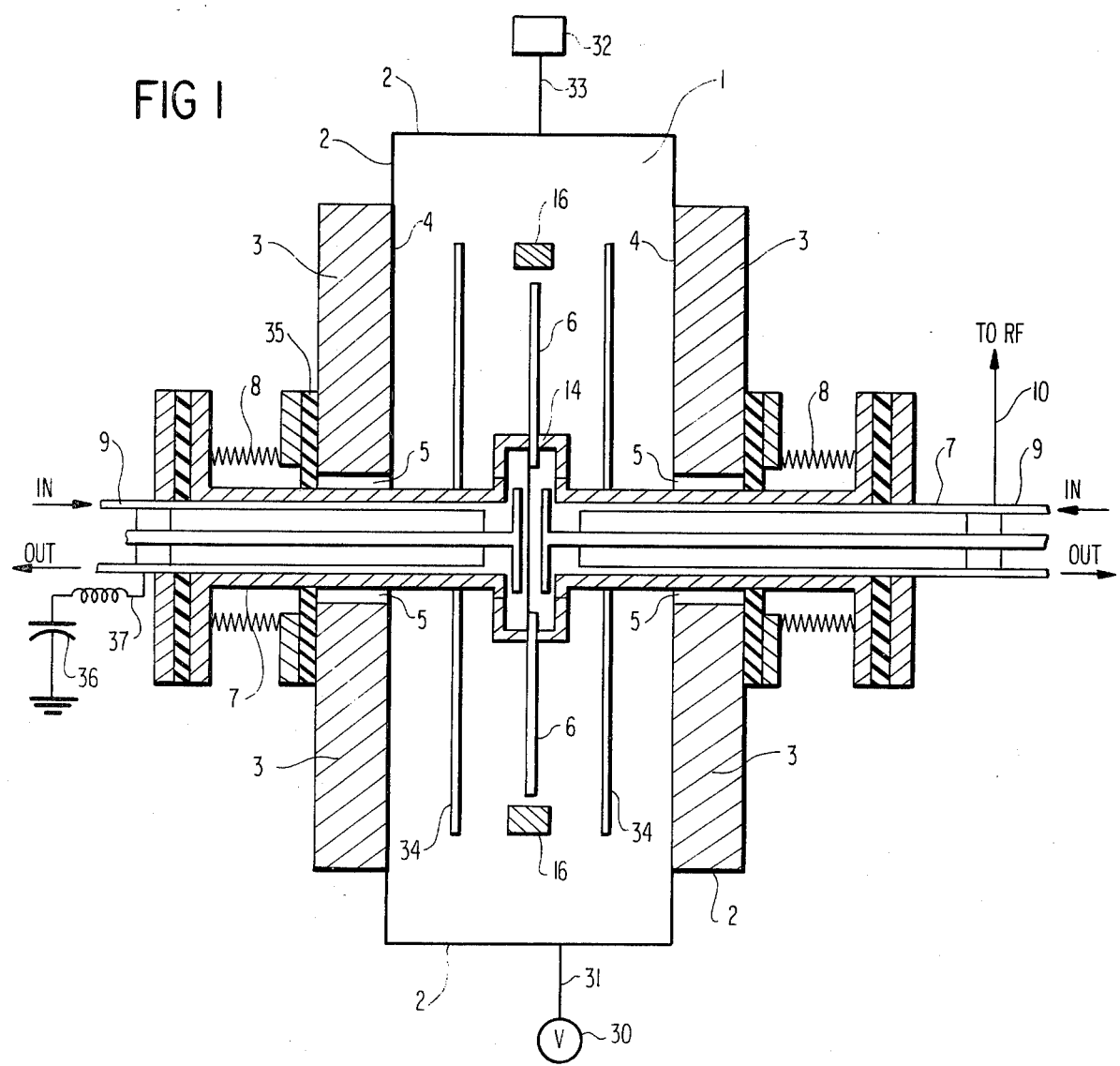
FIG. 1 is a cross-sectional view with certain parts broken away of a cathode sputtering system incorporating the present invention.

FIG. 1 is a cross-sectional view with certain parts broken away of a cathode sputtering system in accordance with the present invention. The vacuum chamber 1 of the sputtering apparatus is enclosed by the horizontal and vertical walls 2, the facing surfaces 4 of the cathode/targets 3, and the ram insulators 35. The vacuum chamber 1 can be evacuated by operation of vacuum pump 30 which is connected to the vacuum chamber 1 via conduit 31.

The gas capable of supporting the sputtering operation is inserted in the vacuum chamber 1 via conduit 33 from gas source 32. Examples of some suitable gases include the inert gases such as argon, krypton, and helium. Argon is the preferred gas employed according to the present invention. The gas is generally employed in amounts sufficient to provide a pressure of about 1 to about 50 microns in the vacuum chamber 1.

A plurality of cathode/targets 3 are provided. The cathode/targets 3 are D.C. planar magnetically enhanced cathodes. As illustrated, the two cathode/targets 3 are mounted parallel to each other. The facing surface 4 of each cathode/target 3 contains the material which is to be sputtered onto the substrate to be coated. Examples of some suitable materials to be sputtered include metals or alloys such as stainless steels, tungsten, and molybdenum. Each cathode/target 3 includes a centrally located cutout portion 5.

In a typical arrangement is employed a large circular cathode having a diameter such as about 18 inches with about a 3-inch diameter centrally located cutout. The magnetic means for enhancing the sputtering about the cathode/target 3 can be included within the targets and contain a plurality of concentric magnetic rings (e.g., about 3 rings). In addition, the cathode/target 3 can be water cooled. The temperature of the cooling water is usually about 15° C. as it enters the target electrode and about 20°–30° C. upon exiting. It is preferred that the magnet and target portions of each of the cathode/targets 3 be an integral one piece element rather than two separate parts affixed together such as by bolting in view of the enhanced cooling achievable by the preferred arrangement.

The cathode/targets 3 are of a dimension (e.g., outside diameter) which are at least about equal to the dimension (e.g., outside diameter) of the substrate to be coated and preferably are larger than the substrate to be coated. In a typical embodiment, the outside diameter of each cathode/target 3 is about 18 inches and the outside diameter of the substrates 6 to be coated is about 14 inches.

Through each centrally located cutout 5 of the cathode/targets is inserted a ram means 7. The ram means are slidable so that they can move in a direction parallel to the facing surfaces 4 of the cathode/targets 3. Numeral 8 designates the slidable means of the rams. The ram means as illustrated in FIG. 1 are capable of movement so as to contact the disk shaped substrate 6 to be coated. Both ram means when acting together in contacting the substrate 6 support the substrate therebetween as illustrated in FIG. 1.

Any type of means can be employed to move the rams 7 back and forth through the cutout portions of the cathode/targets 3 including lead screw means, hydraulic cylinders and pneumatic air cylinders. In a typical arrangement, the clearance between the cathode/target cutout portion and the ram is about ½ inch.

The ram means 7 include means for controlling the temperature thereof which as illustrated in FIG. 1 includes conduits 9 within the ram means for the circulation of a cooling fluid such as water. The coolant is supplied to the hub portion of each ram 7 which contacts the substrate 6. The temperature of the coolant water is generally about 15° C. when it enters and about 20°–30° C. upon exiting the ram. When the ram means are in contact with the substrate to be coated, such will act as a heat sink and will be suitable for controlling the temperature of the substrate 6. The temperature of the substrate during the sputtering should be no more than about 250° C. to prevent warpage of the substrate, and is generally about 100° C. to about 250° C.

The rams 7 are formed of an electrically conductive material and preferably are formed of the same material for the coating to be sputtered onto the substrate 6. At least one of the rams as shown is connected to a source for generating an electrical potential such as being connected to a radio frequency power generator (not shown) via connector 10. In addition, the other ram is connected to ground via a 2 KPF variable capacitor 36 and a water cooled inductor 37 to insure that both rams are at the same electrical potential. Examples of some suitable materials for the rams include copper, aluminum, and stainless steel.

Figure 2:
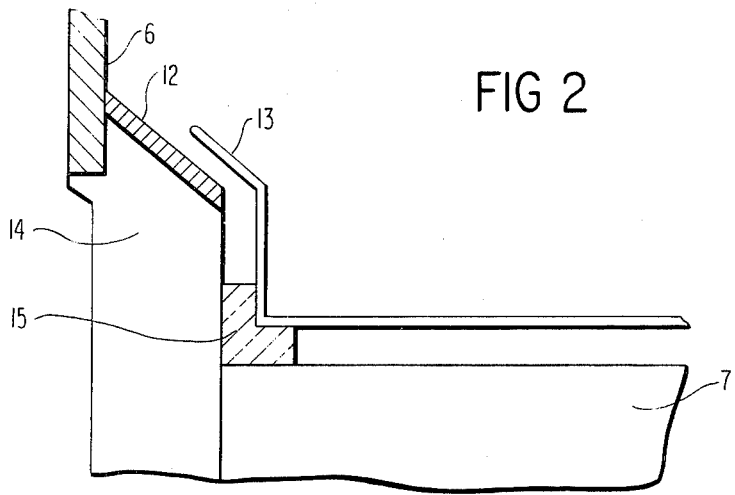
FIG. 2 is an enlarged cross-sectional view showing the support mechanism of the substrate and surrounding apparatus according to the present invention.

FIG. 2 illustrates a preferred hub design of the rams 7 employed according to the present invention. The hub design illustrated in FIG. 2 is preferred since it eliminates a problem which occurs when employing the type of configuration illustrated in FIG. 1 of some etched grooving near the hub due to failure to suppress all of the sputtering of the hub material therein. The improved hub configuration is preferably fabricated from aluminum which provides enhanced thermal and electrical conductivity to the substrate to be coated. The preferred hub configuration forms an oblique angle preferably about 45° between the hub and substrate surface as compared to a 90° angle shown for the hub design in FIG. 1.

The hub 14 is covered with a consumable and replaceable sleeve or collar 12 which can be fabricated from a material such as aluminum, magnesium, or stainless steel. Stainless steel is preferred since it is an acceptable contaminant in the sputtering process and does not significantly affect the thermal or electrical conductivity.

The hub ground shield 13 in the embodiments shown in FIG. 2 is retracted from the substrate surface 6. This positioning of the hub ground shield distorts the Crookes dark space with resultant effects on sputter etch and bias rates over the hub and not on the substrate surface. With the ground shield retracted from the substrate, a portion of the hub surface now sputters.

The preferred hub design has produced uniform sputter etching and biasing of the substrate 6 up to the very edge of the hub assembly. This is compared to sputtering when the hub design demonstrated in FIG. 1 is employed which results in the distortion of Crookes dark space by the hub ground shield producing about a one-half inch wide band around the hub where a significant reduction in sputter etch or bias rate occurs. Located between the hub 14 and ground shield 13 is an electrical insulator 15.

Around the periphery of the substrate 6 is provided a means 16 for suppressing plasma glow. The inside diameter of the glow suppression ring 16 is located within the Crookes dark space of the substrate. Without the glow suppression ring around the periphery of the substrate, it was observed that R.F. sputter etching and biasing occurred only around the outside diameter of the substrate in a band approximately one centimeter wide. The remainder of the substrate surface showed negligible effects of the substrate bias power.

A one-inch substantially square cross-sectional grounded aluminum glow suppression ring 16 was provided around the periphery of the substrate and extending into the Crookes dark space surrounding the substrate.

The ring 16 should not have any sharp edges. The size of the ring is not crucial to the success of the present invention. The important parameter is that the inside diameter of the ring be located within the Crookes dark space of the substrate. For a typical substrate of about 14 inches, the gap between the inside diameter of the ring 16 and the outside diameter of the substrate 6 is about ⅛ inch to about ¼ inch. As the size of the substrate 6 changes, so will this gap so as to maintain the inside diameter of the ring within the Crookes dark space of the substrate.

Figure 3:
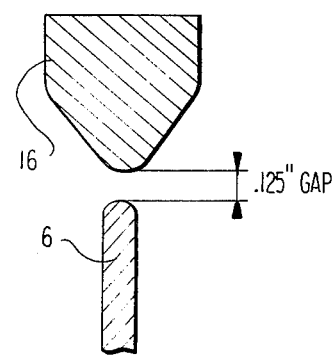
FIG. 3 is an enlarged cross-sectional view showing a portion of a shaped glow suppression ring.
Figure 1:
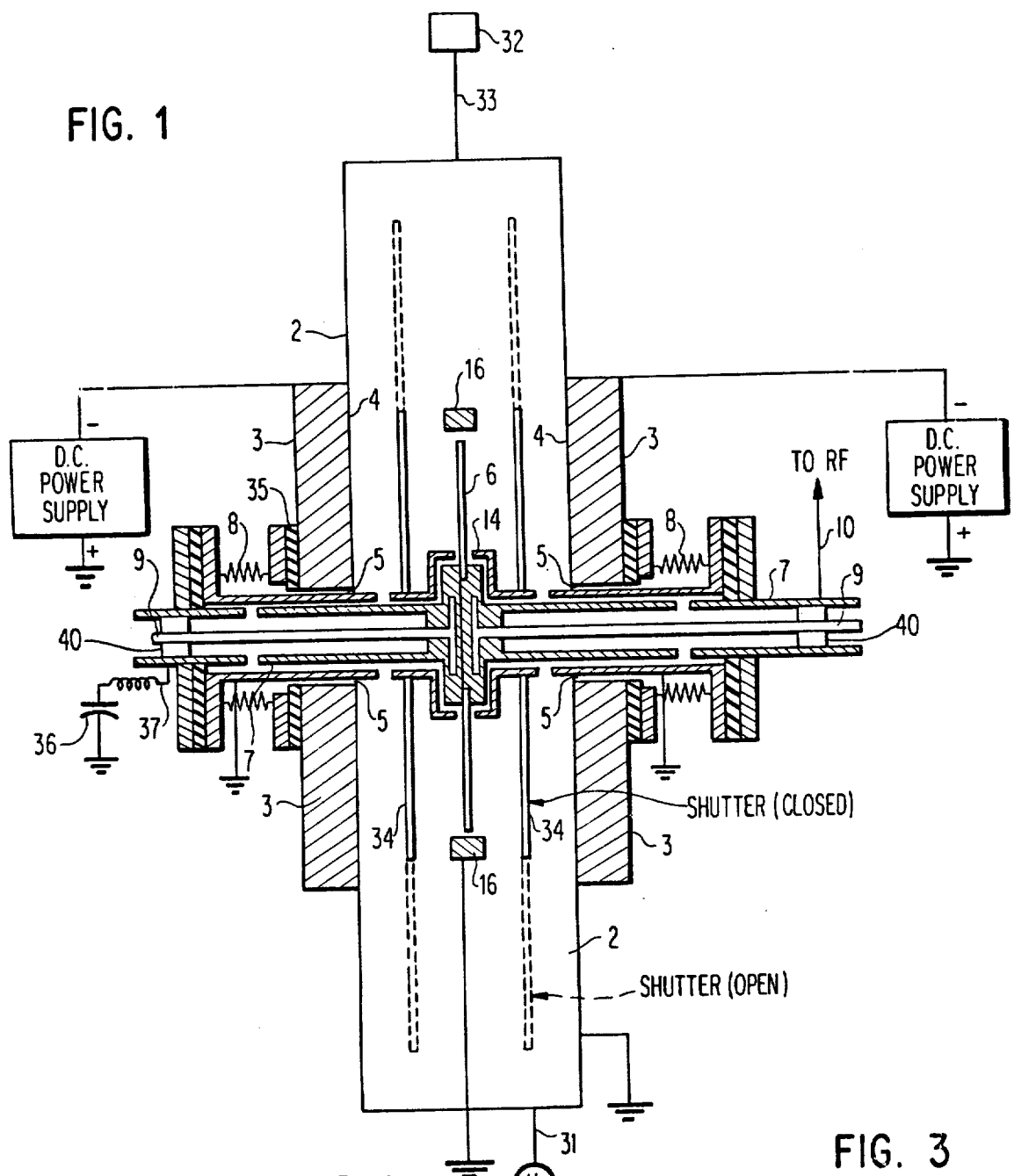
Figure 2:
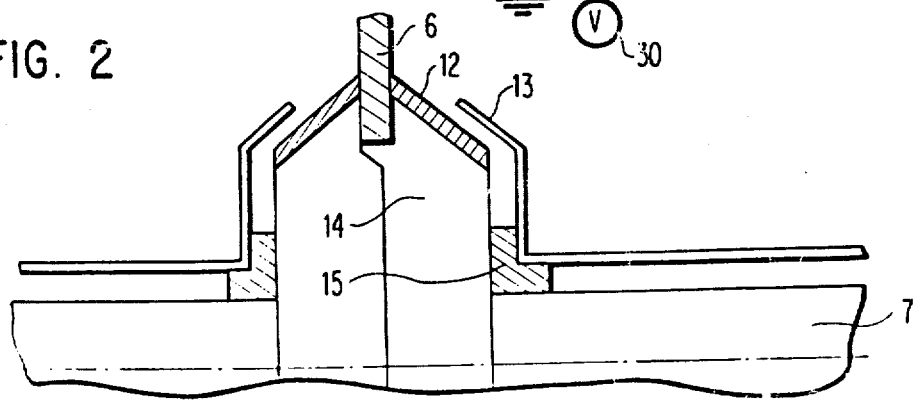
Figure 3:
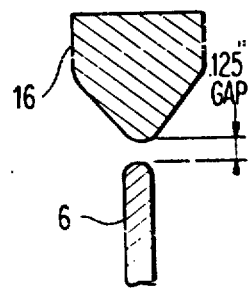

A spacing such as about 0.125 inch spacing is maintained between the substrate outer diameter and the inner diameter of the glow suppression ring. Use of this suppression ring resulted in sputter etching and biasing of the entire surface of the substrate 6 with the exception of only a one centimeter wide band around the outside diameter. A portion of the substrate where the hub contacts the substrate was discolored somewhat. In order to coat even this small additional portion of the substrate, a shaped cross-section grounded glow suppression ring as illustrated in FIG. 3 was employed. This preferred configuration which is about a 45° taper beginning from about the middle of the square ring resulted in sputter etching of the entire surface of the substrate. The ring has no sharp edges and tapers to a point which is about equal in thickness to the substrate. The plane of the substrate and the plane of the glow suppression ring must be aligned so that the suppression ring is around the periphery of the substrate.

As discussed hereinabove, the presence of a glow suppression ring around the periphery of the substrate is critical to the successful practice of the present invention. For instance, attempts to sputter etch both sides of the substrate without employing a glow suppression ring in the configuration of the present invention were not successful. In particular, employing about 3 kilowatt forward power, about a 175 watt reflected power, with 10 microns of argon pressure and a total etch time of 60 minutes resulted in sputtering of only about ⅜ inch at the outer diameter of the substrate along with some discoloration and slight etching around the area contacting the hub of the ram which was caused by the hub glow suppression assembly. Without the presence of the glow suppression ring, there is insufficient uniformity of R.F. power on the substrate in order to sputter etch to any significant degree.

On the other hand, when employing a square cross-sectional glow suppression ring as illustrated in FIG. 1 and etching for about 60 minutes under about 10 microns argon pressure at 3 kilowatt forward power, the substrate was visibly sputter etched over the entire surface except for only the outer one centimeter of the radius and about 1.3 centimeters wide area of discoloration around the inside diameter at the place where the hub of the ram contacts the substrate.

The use of a glow suppression ring of the configuration illustrated in FIG. 3 results in sputter etching of the entire surface of the substrate except for the portion around the inside diameter due to the effect of the hub of the ram. When using the preferred hub configuration of FIG. 2 as discussed hereinabove, this effect of the hub is minimized.

If desired, preselected portions of the substrate can be masked or shielded from sputter etching by placing (e.g., such as by bolting) a metallic mask segment onto the desired preselected portion of the substrate. This can be done without affecting the cathode current density.

In the operation of the present invention, some self-sustained discharges forming on the surfaces of the system coated with sputter etched substrate material were noted. These discharges however can be readily eliminated by slowly "burning in" the system surfaces without the substrate being present. For instance, about 5 to 10 minutes of "burn in" is suitable for such purpose to achieve stable R.F. sputter etching. In particular, self-sustained discharges can be eliminated, in the R.F./D.C. system with the application of 300 to about 600 $V_{DC}$ at about 2 to about 14 amperes to either or both of the planar cathodes. After about 5 minutes of controlled, measureable R.F. sputter etching in this manner, the D.C. potential can be removed and no further discharges will occur.

The sputter apparatus can optionally include shutters 34 as illustrated in FIG. 1, when closed, for the above purpose if desired. These shutters can be used to permit simultaneous sputter etching of the substrate to remove contamination and D.C. target presputtering. The preferred apparatus does not include the shutters.

Typical operating conditions of the apparatus of the present invention include D.C. power of about 1–15 amps, and about 300–600 volts; R.F. power of about 1–3 Kw., sputter gas pressure of about 1–50 microns; substrate temperature of about 100°–250° C.; sputtering time up to about 30 minutes; and rate of deposition of about 500 to about 2000 angstroms/minute to provide about 5–20 microns thick films on both sides of the substrate.

Some advantages achieved by the present invention include the ability for R.F. bias and D.C. sputtering in the same chamber on both sides of the substrate simultaneously, as well as a significant decrease in deposition time of at least a factor of about three over that achieved by the use of standard sputtering targets and substrate rotation. Furthermore, the bias sputtering allows better substrate coverage in one coat and gives higher density film. The present invention also eliminates the need for rotation of the substrate for coating the entire substrate surface. It has further been noted that the present invention results in a lower pinhole count in deposited films as a result of R.F. biasing.

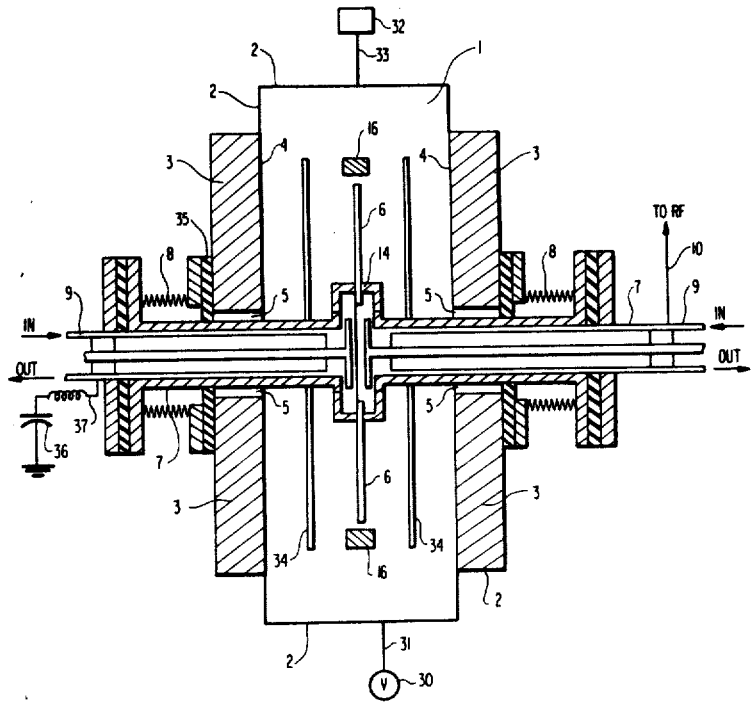

Having thus described our invention, what we claim as new, and desire to secure by Letters Patent is:

1. A sputtering apparatus for coating both sides of a flat substrate comprising:

a vacuum chamber;

means for evacuating gases from said vacuum chamber;

means for inserting a gas capable of supporting a sputtering operation;

a plurality of planar cathode/targets, at least two being mounted parallel to each other and each including a centrally located cutout, said cathode/targets including a material of the coating to be sputtered on the substrate on at least the facing surface;

a pair of ram means for insertion through the cutout of both parallel cathode/targets for slidable movement therewith, one end of each of said rams lying between the parallel cathode/targets and forming a hub to contact and support the substrate therebetween;

means around the periphery of the substrate for suppressing plasma glow;

magnetic means for enhancing the sputtering about both parallel cathode/targets;

means connected to both of said rams for controlling the temperature of the substrate; and means connected to at least one of said rams for applying an electrical potential for biasing the substrate;

said rams formed of an electrically conductive material and including means for transmitting said temperature controlling means to the substrate.

2. The sputtering apparatus of claim 1 wherein the means for suppressing plasma glow has a substantially square cross-section.

3. The sputtering apparatus of claim 1 wherein the means for suppressing plasma glow has a tapered cross-sectional configuration.

4. The sputtering apparatus of claim 1 wherein the means for suppressing plasma glow has a cross-section which is about a 45° taper beginning at about the midpoint of the cross-section and ending at a point which is about equal in thickness to the thickness of the substrate to be coated, and which does not contain any sharp edges.

5. The sputtering apparatus of claim 1 wherein the cathode/targets are water cooled.

6. The sputtering apparatus of claim 1 wherein the hub of each ram forms an oblique angle with the substrate surface.

7. The sputtering apparatus of claim 1 wherein the hub of each ram forms about a 45° angle with the substrate surface.

8. The sputtering apparatus of claim 1 wherein the hub of each ram is covered with a consumable and replaceable collar.

9. The sputtering apparatus of claim 1 further comprising hub ground shields for the hub of each of the rams, said ground shields being located at a retracted position from the substrate surface.

10. A method for sputter coating both sides of a flat substrate at the same time without rotation of the substrate which comprises:

placing the substrate to be coated in a vacuum chamber between at least two planar cathode/targets mounted parallel to each other of a dimension at least approximately equal to said substrate and wherein said cathode/targets include a material of the coating to be sputtered on or at the surface facing said substrate, and include a centrally located cutout;

supporting said substrate between said cathode/targets by contacting said substrate with a pair of ram means slidably inserted through the cutout of the parallel cathode/targets;

evacuating gases from said chamber;

inserting a gas capable of supporting sputtering into said chamber;

providing magnetically enhanced sputtering about the parallel cathode/targets;

applying an electrical potential for biasing the substrate through at least one of said rams which are formed of electrically conductive material;

controlling the temperature of said substrate via contact with said rams; and employing means to suppress plasma glow around the periphery of said substrate and thereby obtain a radially uniform sputtered coating on both sides of said substrate.

11. The sputtering method of claim 2 wherein said cathode/target and said substrate are circular in shape and the cathode/target has an outside diameter greater than the outside diameter of the substrate to be employed.

12. The sputtering method of claim 2 wherein the means for suppressing plasma glow is located within the Crookes dark space of the substrate.

UNITED STATES PATENT AND TRADEMARK OFFICE
CERTIFICATE OF CORRECTION

PATENT NO. : 4,183,797

DATED : January 15, 1980

INVENTOR(S) : Thomas N. Kennedy, et al

It is certified that error appears in the above—identified patent and that said Letters Patent is hereby corrected as shown below:

Column 4, line 14, after the word "water.", add --The numeral 40 represents the support for conduits 9 and also provides a seal.--.

The title page and the sole sheet of drawing should be deleted to appear as per attachments.

Signed and Sealed this

Twenty-second Day of July 1980

[SEAL]

Attest:

SIDNEY A. DIAMOND

Attesting Officer

Commissioner of Patents and Trademarks

United States Patent [19] [11] 4,183,797
Kennedy et al. [45] Jan. 15, 1980

[54] TWO-SIDED BIAS SPUTTER DEPOSITION METHOD AND APPARATUS

[75] Inventors: Thomas N. Kennedy, San Jose; William C. Lester, Los Gatos; George W. McDonough, Cupertino; John D. Michaelsen, Los Gatos, all of Calif.

[73] Assignee: International Business Machines Corporation, Armonk, N.Y.

[21] Appl. No.: 972,593

[22] Filed: Dec. 22, 1978

[51] Int. Cl.² .................................................. C23C 15/00
[52] U.S. Cl. ...................................... 204/192 R; 204/298
[58] Field of Search ........................... 204/298, 192 R

[56] References Cited

U.S. PATENT DOCUMENTS

| 3,627,663 | 12/1971 | Davidse | 204/192 |
|---|---|---|---|
| 3,741,886 | 6/1973 | Urbanek et al. | 204/298 |
| 3,878,085 | 4/1975 | Corbani | 204/298 |
| 3,979,273 | 9/1976 | Panzera et al. | 204/192 |
| 4,013,532 | 3/1977 | Cormia et al. | 204/298 |
| 4,073,262 | 2/1978 | Scheffel et al. | 118/52 |

OTHER PUBLICATIONS

D. R. Rogalla, Coating Magnetic Storage Disks; IBM Technical Disclosure Bulletin, vol. 11, No. 11, Apr. 1969, p. 1611.

Primary Examiner—John H. Mack
Assistant Examiner—William Leader
Attorney, Agent, or Firm—Pollock, Vande Sande & Priddy

[57] ABSTRACT

Method and apparatus for coating a thin film upon a substrate in a vacuum chamber using the sputter deposition technique on both sides of the substrate without rotation of the substrate. The substrate is held between two movable rams and is located between two targets equal to or larger in size than the substrate. The rams supply power and cooling to the substrate. A glow suppression ring circumscribes the periphery of the substrate. The cathodes of the sputtering system can be magnetically enhanced for concentration of the sputtering plasma.

12 Claims, 3 Drawing Figures